United States Patent
Easley et al.

(10) Patent No.: US 7,397,850 B2
(45) Date of Patent: Jul. 8, 2008

(54) RECIPROCAL INDEX LOOKUP FOR BTSC COMPATIBLE COEFFICIENTS

(76) Inventors: Mathew F. Easley, 1058 Fairway Valley Dr., Woodstock, GA (US) 30189; Roger Darr, 5419 Pepperbush Ct., Sugar Hill, GA (US) 30518; Matthew Barnhill, 3570 Hermitage Dr., Duluth, GA (US) 30096

( * ) Notice: Subject to any disclaimer, the term of this patent is extended or adjusted under 35 U.S.C. 154(b) by 707 days.

(21) Appl. No.: 10/407,041

(22) Filed: Apr. 4, 2003

(65) Prior Publication Data

US 2003/0198352 A1 Oct. 23, 2003

Related U.S. Application Data

(63) Continuation-in-part of application No. 09/506,989, filed on Feb. 18, 2000, now Pat. No. 6,588,867.

(60) Provisional application No. 60/370,064, filed on Apr. 4, 2002, provisional application No. 60/120,608, filed on Feb. 18, 1999.

(51) Int. Cl.
*H04B 1/66* (2006.01)
(52) U.S. Cl. ................... 375/240; 375/232
(58) Field of Classification Search ................ 375/240, 375/240.06, 240.07, 240.04, 262, 229, 232, 375/341; 381/106
See application file for complete search history.

(56) References Cited

U.S. PATENT DOCUMENTS

| | | | | |
|---|---|---|---|---|
| 5,091,957 A | * | 2/1992 | Anderson et al. | ........... 381/106 |
| 5,148,275 A | * | 9/1992 | Blatter et al. | ................ 348/567 |
| 5,315,660 A | * | 5/1994 | Anderson et al. | ............. 381/13 |
| 5,377,272 A | * | 12/1994 | Albean | ......................... 381/13 |
| 5,684,878 A | * | 11/1997 | Nagura | .......................... 381/4 |
| 5,987,141 A | * | 11/1999 | Hoover | .......................... 381/1 |
| 6,118,879 A | * | 9/2000 | Hanna | ......................... 381/106 |
| 6,259,482 B1 | | 7/2001 | Easley et al. | ................. 348/485 |
| 6,351,631 B1 | * | 2/2002 | Noeske et al. | ................ 455/260 |
| 6,588,867 B1 | | 7/2003 | Darr | ...................... 325/240.07 |
| 2007/0016316 A1 | * | 1/2007 | Hanna | .......................... 700/94 |

OTHER PUBLICATIONS

Crochiere, R. E., et al., "Multirate Digital Signal Processing", Prentice-Hall, Inc., Englewood Cliffs, NJ 07632, 1983, pp. 1-3.

* cited by examiner

Primary Examiner—Emmanuel Bayard

(57) ABSTRACT

An algorithm calculates spectral compression/expansion filter coefficients using a value proportional to a reciprocal of a feedback/feedforward signal and stores the coefficients to a lookup table. The lookup table is indexed by a pre-selected set of coefficient bits to generate a filter coefficient function. A first portion of the lookup table stores a plurality of discrete values at index points of a line segment corresponding to a filter coefficient function approximation, so as to generate an initial discrete value corresponding to the filter coefficient function at a value of the high order bits and a second portion stores a plurality of slope values, which indicates a slope of the filter coefficient function. A linear circuit interpolates/decimates an approximation of the compression/expansion filter coefficient function based on the slope value, the initial discrete value and a preselected set of low order bits of the reciprocal value.

20 Claims, 8 Drawing Sheets

BTSC Expander
(plus decimation filter)

RECIPROCAL INDEX LOOKUP FOR BTSC COMPATIBLE COEFFICIENTS

CROSS-REFERENCE TO PROVISIONAL APPLICATION

This application claims priority under 35 U.S.C. §119(e) on provisional patent application Ser. No. 60/370,064 filed on Apr. 4, 2002, the disclosure of which is incorporated herein by reference in its entirety.

CROSS-REFERENCE TO RELATED APPLICATION

This is a continuation-in-part of patent application Ser. No. 09/506,989 filed on Feb. 18, 2000, now U.S. Pat. No. 6,588,867 the disclosure for which is incorporated herein by reference in its entirety, having a priority date of Feb. 18, 1999, based on provisional patent application Ser. No. 60/120,608.

BACKGROUND

1. Field of the Invention

The present invention relates to audio companding systems and, more specifically, to an apparatus for digitally implementing the compression and expansion functions in a BTSC decoder and encoder.

2. Description of the Prior Art

BTSC-compatible encoders and decoders are used to encode and decode stereo audio signals into NTSC television compatible audio signals. Existing systems typically use an analog approach. The analog approach is environmentally sensitive and, in the case of the encoder, requires extra circuitry to be compatible with digital television systems.

Existing digital BTSC encoder and decoder implementations require complex circuitry to facilitate determination of BTSC variable spectral preemphasis and deemphasis filter coefficients. The encoder implements the variable spectral preemphasis function. The decoder implements the variable spectral deemphasis function. In the case of the encoder, a feedback function is utilized to calculate the coefficients. In the case of the decoder, a feedforward function is utilized to calculate the coefficients. The transfer function of the decoder variable de-emphasis filter is simply the inverse of the encoder preemphasis filter. The filter coefficients are calculated in the same manner for both the encoder and decoder. Such circuitry is made complex because the feedback (feedforward) functions used to calculate the coefficients tend to exhibit a sharp bend, thereby causing the function to behave in a nonlinear fashion. Such non-linearity reduces the precision of interpolated coefficients. Therefore, there is a need for a circuit that employs a nearly linear aspect of the BTSC feedback (feedforward) function to facilitate more precise interpolation of BTSC filter coefficients.

SUMMARY

In the following, where a component that has applicability in a compressor and in an expander is described, the compressor-related descriptor will be used followed by the expansion-related complementary descriptor in parenthesis.

One aspect is a method of calculating a variable spectral compression (expansion) filter coefficient in a BTSC compatible stereo encoder (decoder) from a feedback (feedforward) variable. A reciprocal value that is proportional to a reciprocal of the feedback (feedforward) variable is calculated. A lookup table is indexed using a preselected set of bits of the reciprocal value to generate at least one parameter of the filter coefficient function. An approximation of the compression filter coefficient is linearly interpolated based on the, at least, one parameter of the filter coefficient function.

In another aspect, a method of calculating a variable spectral compression (expansion) filter coefficient in a BTSC compatible stereo encoder (decoder) from a feedback (feedforward) variable. A reciprocal value that is proportional to a reciprocal of the feedback (feedforward) variable is calculated. A lookup table is indexed using a preselected set of high order bits of the reciprocal value. A first portion of the lookup table stores a plurality of discrete values at index points of a line segment corresponding to a filter coefficient function approximation. The first portion of the lookup table generates an initial discrete value corresponding to the filter coefficient function at a value of the high order bits. A second portion of the lookup table stores a plurality of slope values with each slope value indicating a slope of a line segment of the filter coefficient function. The second portion of the lookup table generates a slope value of a line segment corresponding to the filter coefficient function at the value of the high order bits. An approximation of the compression filter coefficient is linearly interpolated based on the slope value, the initial discrete value and a preselected set of low order bits of the reciprocal value.

In yet another aspect, an apparatus that includes circuitry that calculates a variable spectral compression (expansion) filter coefficient in a BTSC compatible stereo encoder (decoder) from a feedback (feedforward) variable. The apparatus includes a reciprocal value circuit that calculates a reciprocal value that is proportional to a reciprocal value of the feedback (feedforward) variable. The apparatus also includes a lookup table that is indexed by a preselected set of high order bits of the reciprocal value, wherein a first portion of the lookup table stores a plurality of discrete values at index points of a line segment corresponding to a filter coefficient function approximation, so as to generate an initial discrete value corresponding to the filter coefficient function at a value of the high order bits, and wherein a second portion of the lookup table stores a plurality of slope values, each slope value indicating a slope of a line segment of the filter coefficient function, so as to generate a slope value of a line segment corresponding to the filter coefficient function at the value of the high order bits. A linear interpolation circuit interpolates an approximation of the compression filter coefficient based on the slope value, the initial discrete value and a preselected set of low order bits of the reciprocal value.

In yet another aspect, an apparatus is described for digitally implementing the entire expander portion of a BTSC decoder. This implementation includes the variable spectral expander, two feedforward loops, a decimator and fixed deemphais functions. The apparatus utilizes digital models of the BTSC expander continuous time transfer functions. The circuitry also includes decimation and sampling circuitry that allows the implementation to utilize a variety or sampling rates.

These and other aspects of the invention will become apparent from the following description of the preferred embodiments taken in conjunction with the following drawings. Many variations and modifications of the invention may be effected without departing from the spirit and scope of the novel concepts of the disclosure.

DETAILED DESCRIPTION

Figure 1:
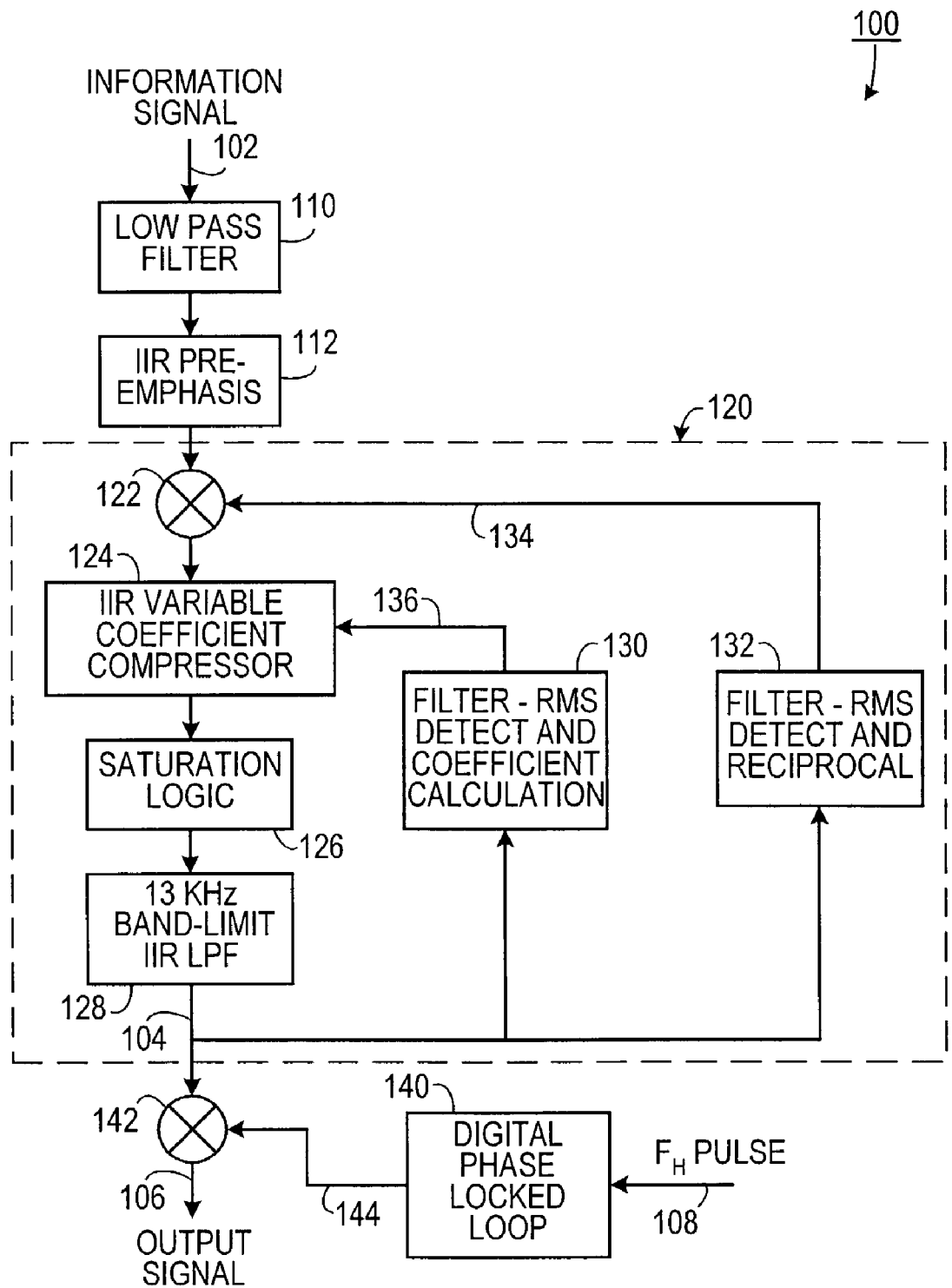
FIG. 1 is a schematic diagram of the compressor portion of a BTSC-compatible encoder according to one embodiment of the invention.

Referring to the drawings, like numbers indicate like parts throughout the views. As used herein, a digital BTSC-compatible stereo television difference signal is one component of a digital stereo audio signal that can be decoded (expanded) by a decoder that complies with the BTSC stereo television standard. The difference signal begins simply as the difference between the left and right audio signals of a stereo audio source. A BTSC stereo encoder then compresses it. The input to the expander section of a BTSC decoder is this compressed difference signal. The expander restores the original difference signal. One skilled in the art will appreciate that the decoder typically performs functions that are the inverse of corresponding functions at an encoder. One skilled in the art will also appreciate that the compressor and expander functions of a BTSC encoder and decoder are also applied to the Second Audio Program (SAP) channel in a BTSC audio system.

As shown in FIG. 1, the BTSC-compatible encoder is an application specific integrated circuit 100 in which a low pass filter 110 receives a digital representation 102 of an audio signal having a sample rate of Fs. The audio signal could include difference left minus right components or it could include a SAP component, depending upon the specific application. The low pass filter 110 generates a corresponding second digital signal having a pseudo-interpolated sampling rate of $4F_S$. A digital infinite impulse response pre-emphasis filter 112 generates a pre-emphasized output signal corresponding to the second digital signal, in accordance with the BTSC standard. A digital signal compressor 120 receives the pre-emphasized output signal and generates a compressed digital difference signal 104.

Figure 3:
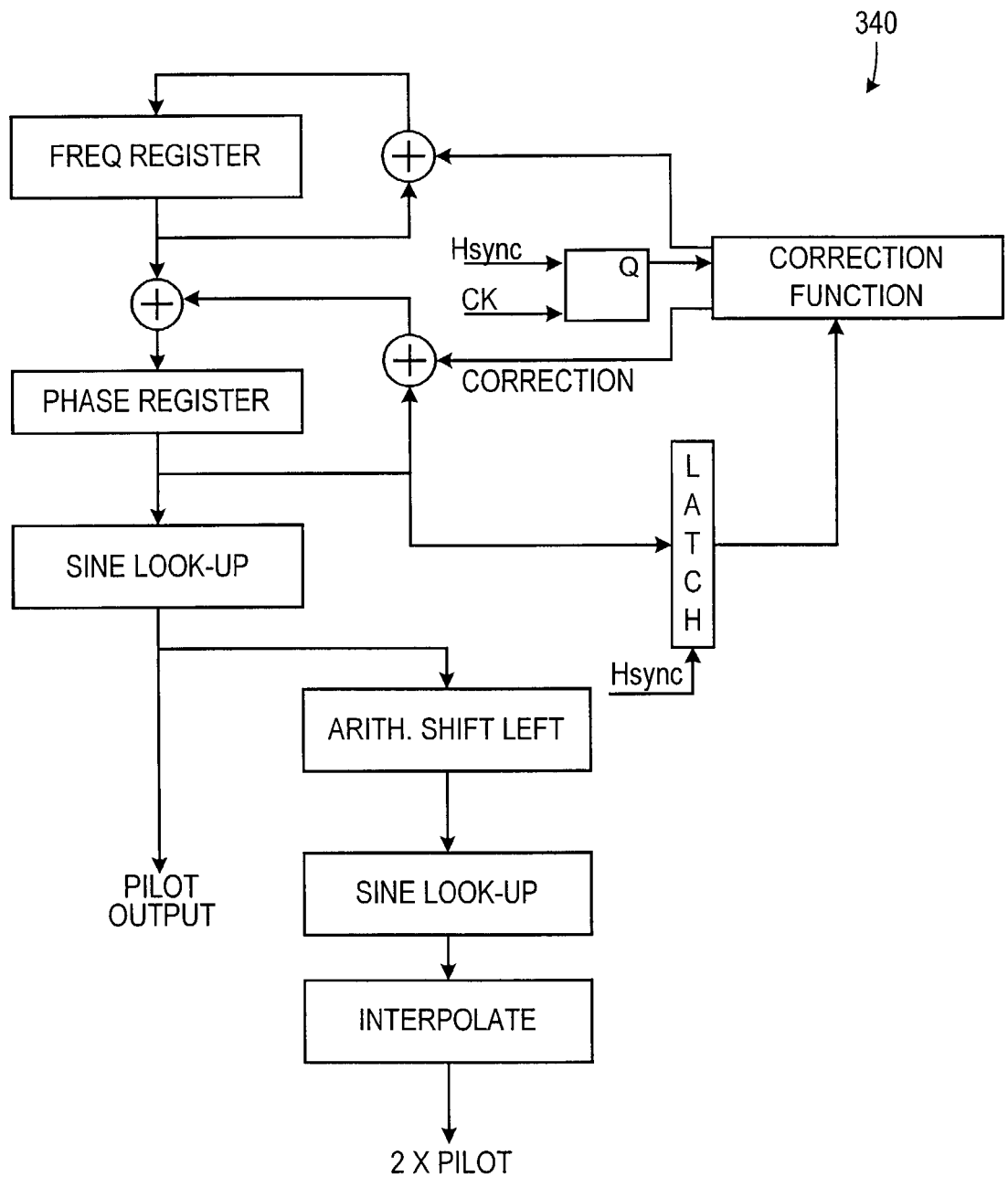
FIG. 3 is a schematic diagram of a digital phase locked loop employed in the embodiment of FIG. 1.

A digital phase locked loop 140 that is responsive to a video sync pulse 108 having a sync pulse frequency ($F_H$) generates a third digital signal 144 corresponding to a sinusoid having a frequency equal to twice the sync pulse frequency and a having a sampling frequency equal to 4 $F_S$. A first digital multiplier 142 multiplies the compressed digital signal 104 by the third digital signal 144 to generate a digital BTSC-compatible stereo television difference signal 106. Multiplier 142 facilitates amplitude modulation of carrier signal 144 with signal 104. One embodiment 340 of the digital phase locked loop 140 is shown in FIG. 3.

Figure 2:
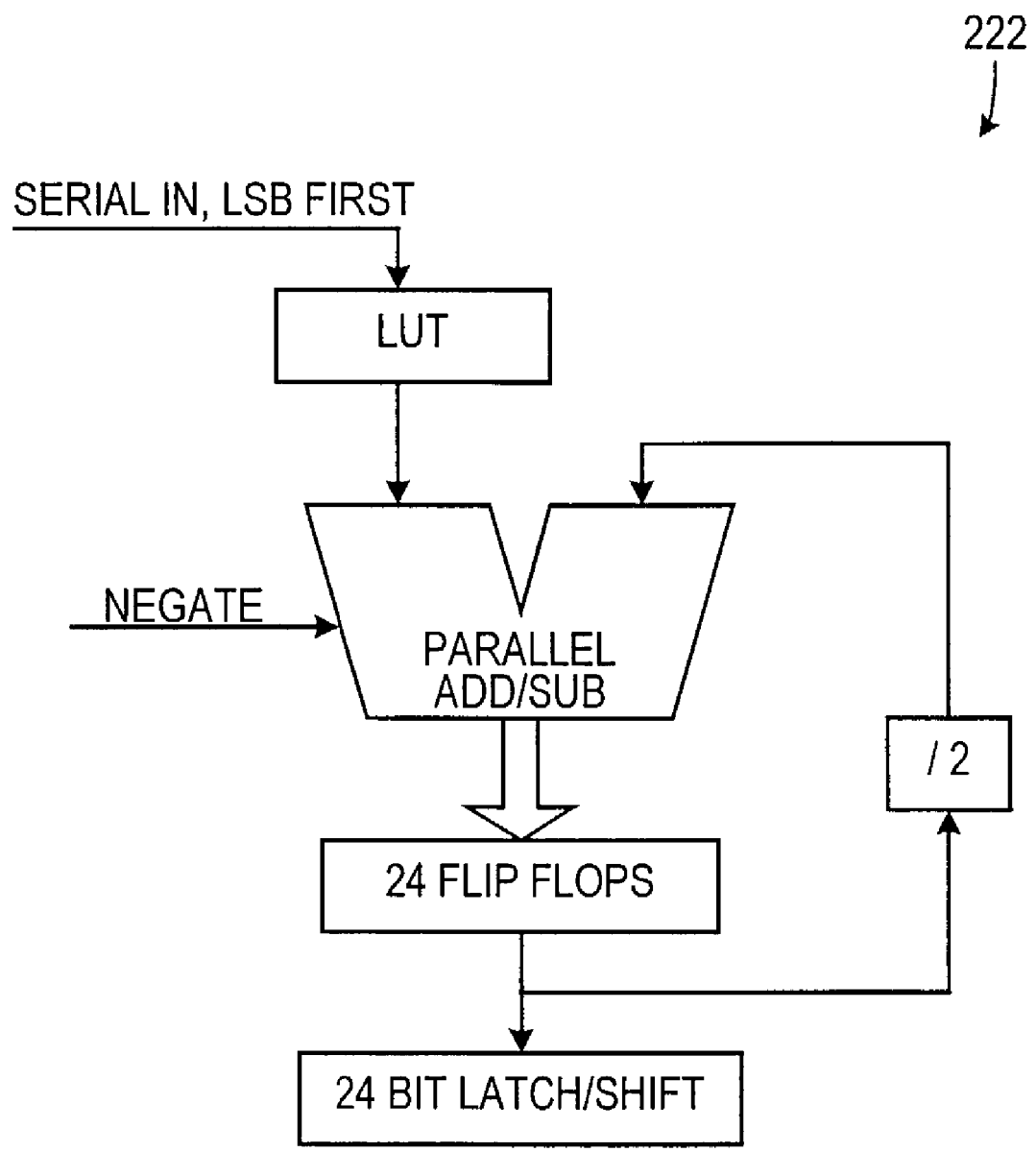
FIG. 2 is a schematic diagram of a serial multiplier employed in the embodiment of FIG. 1.

Returning to FIG. 1, the digital signal compressor 120 includes a second digital multiplier 122 that multiplies the pre-emphasized output signal by a first feedback signal 134, thereby generating a digital feedback-multiplied signal. (The multiplier could be a serial multiplier 222 of the type shown in FIG. 2.) An infinite impulse response variable coefficient compressor 124, that is responsive to the feedback-multiplied signal and responsive to a digital coefficient feedback signal 136, generates a digital dynamic range-limited signal corresponding to the feedback-multiplied signal limited to a predetermined dynamic range. Essentially, the infinite impulse response variable coefficient compressor 124 narrows the dynamic range of the feedback-multiplied signal. A saturation logic circuit 126 generates a digital amplitude-limited signal corresponding to the digital dynamic range-limited signal limited to a predetermined amplitude range. A digital band-limited infinite impulse response low pass filter 128, that is responsive to the amplitude-limited signal, generates a digital band-limited signal corresponding to the amplitude-limited signal that serves as the compressed digital difference signal 104. In the disclosed embodiment, the digital band-limited infinite impulse response low pass filter 128 cuts off signals above 13 KHz, thereby eliminating certain harmonics. Although various cutoff frequencies may be chosen for a particular application, the cutoff of 13 KHz was chosen for a low cost subscriber implementation. A cutoff of 15 KHz could be used for a headend application or a higher fidelity subscriber application. The cutoff frequency for a SAP implementation would typically be 10 KHz.

Figure 4:
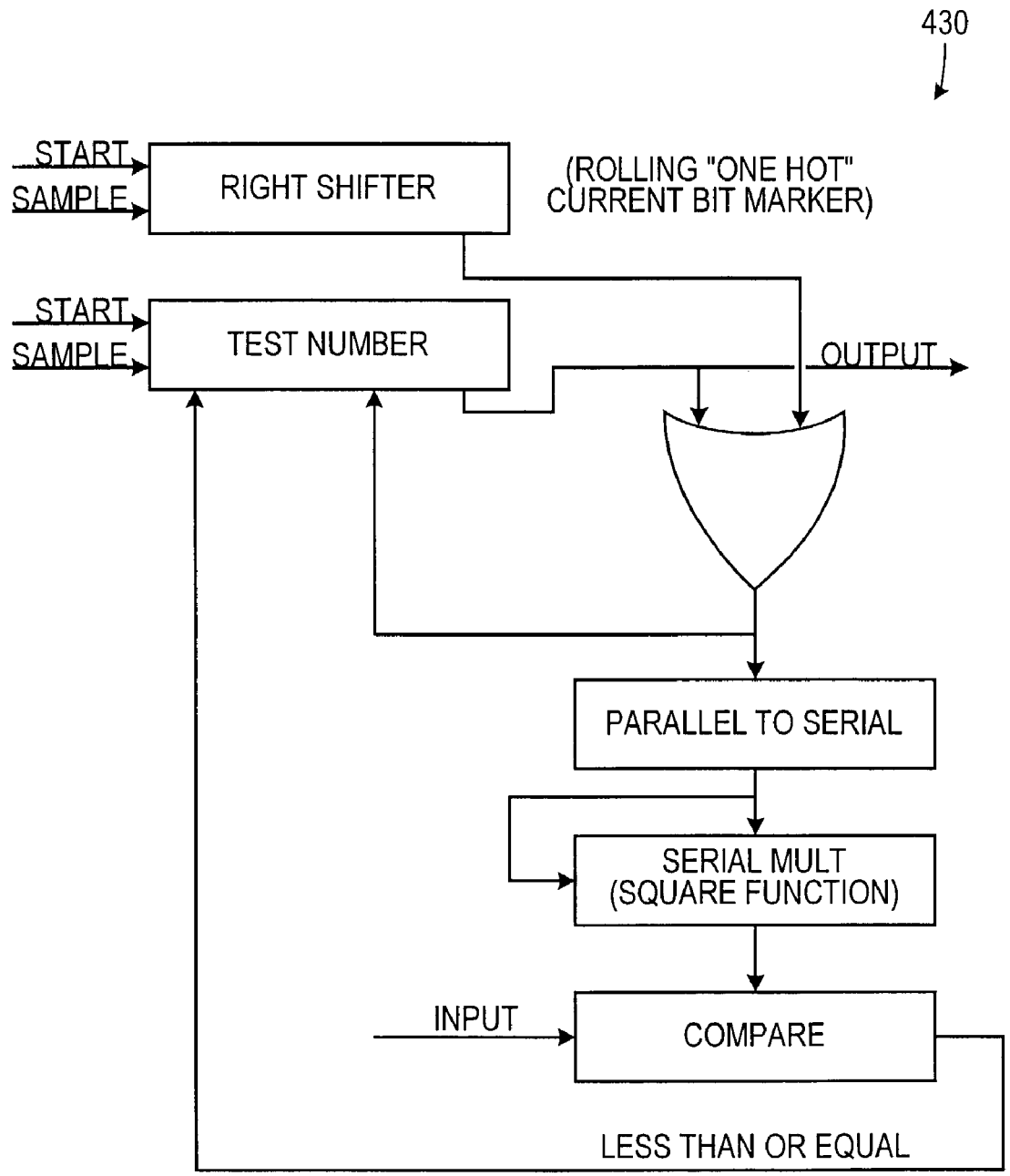
FIG. 4 is a schematic diagram of a positive square root finder employed in the embodiment of FIG. 1.
Figure 5:
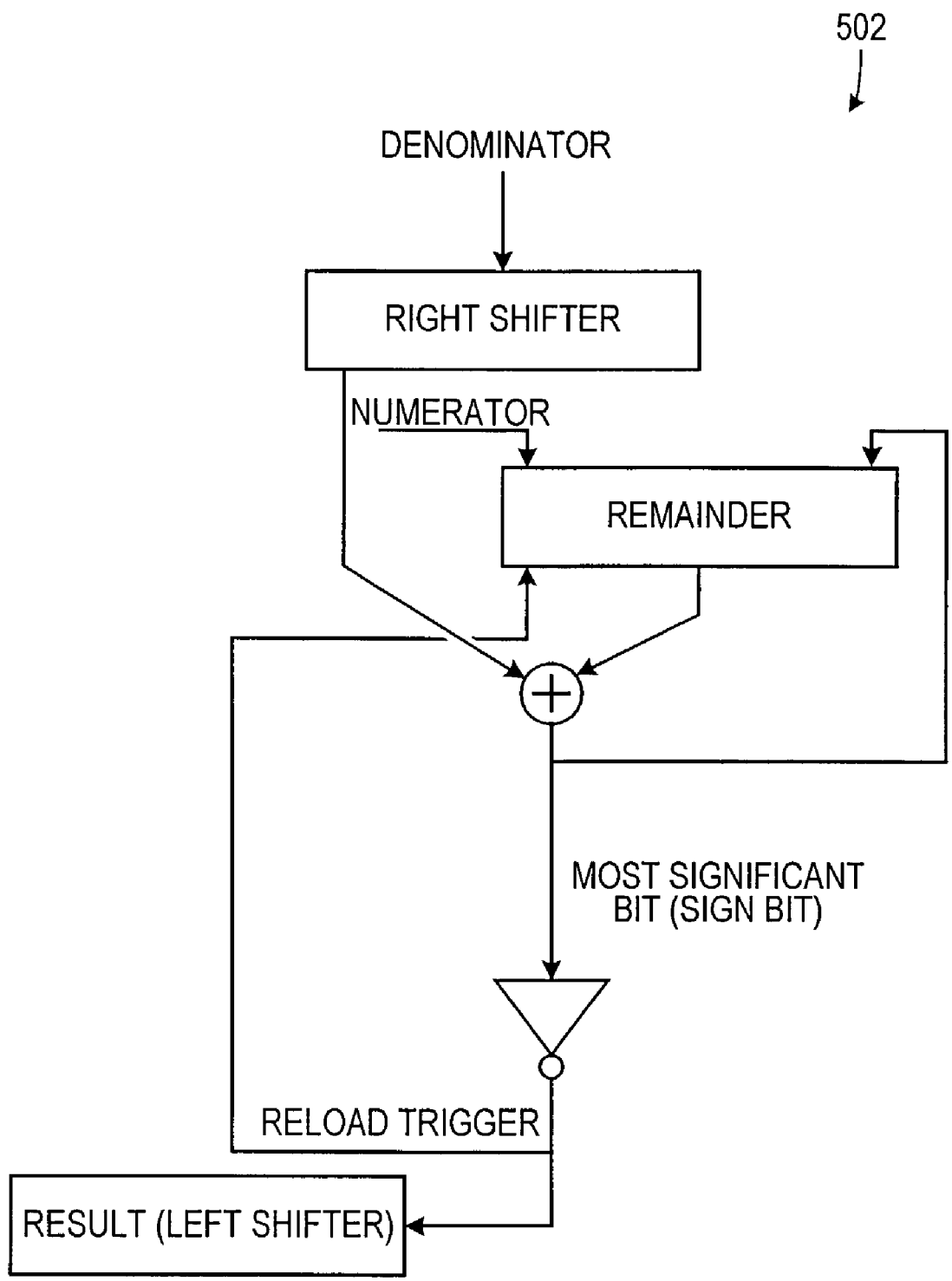
FIG. 5 is a schematic diagram of a serial divider employed in the embodiment of FIG. 1.

A first feedback circuit 130, that is responsive to the band-limited signal, includes a root-mean-squared (RMS) level detector and generates the first feedback signal indicative of an amplitude of the band-limited signal (In one embodiment, the RMS level detector includes a positive square root finder 430, as shown in FIG. 4.) The first feedback circuit 130 also includes a band pass filter that passes signals in a relatively higher frequency range. In the disclosed embodiment, this filter passes frequencies around 11 KHz. A second feedback circuit 132, responsive to the band-limited signal, generates the coefficient feedback signal based on the band-limited signal. The second feedback circuit 132 also includes an RMS level detector and a band pass filter that passes lower frequencies. In the disclosed embodiment, this frequency range is between approximately 30 Hz and 3000 Hz. The second feedback circuit 132 also employs a divider 502 (as shown in FIG. 5) to generate a reciprocal signal value.

Figure 6A:
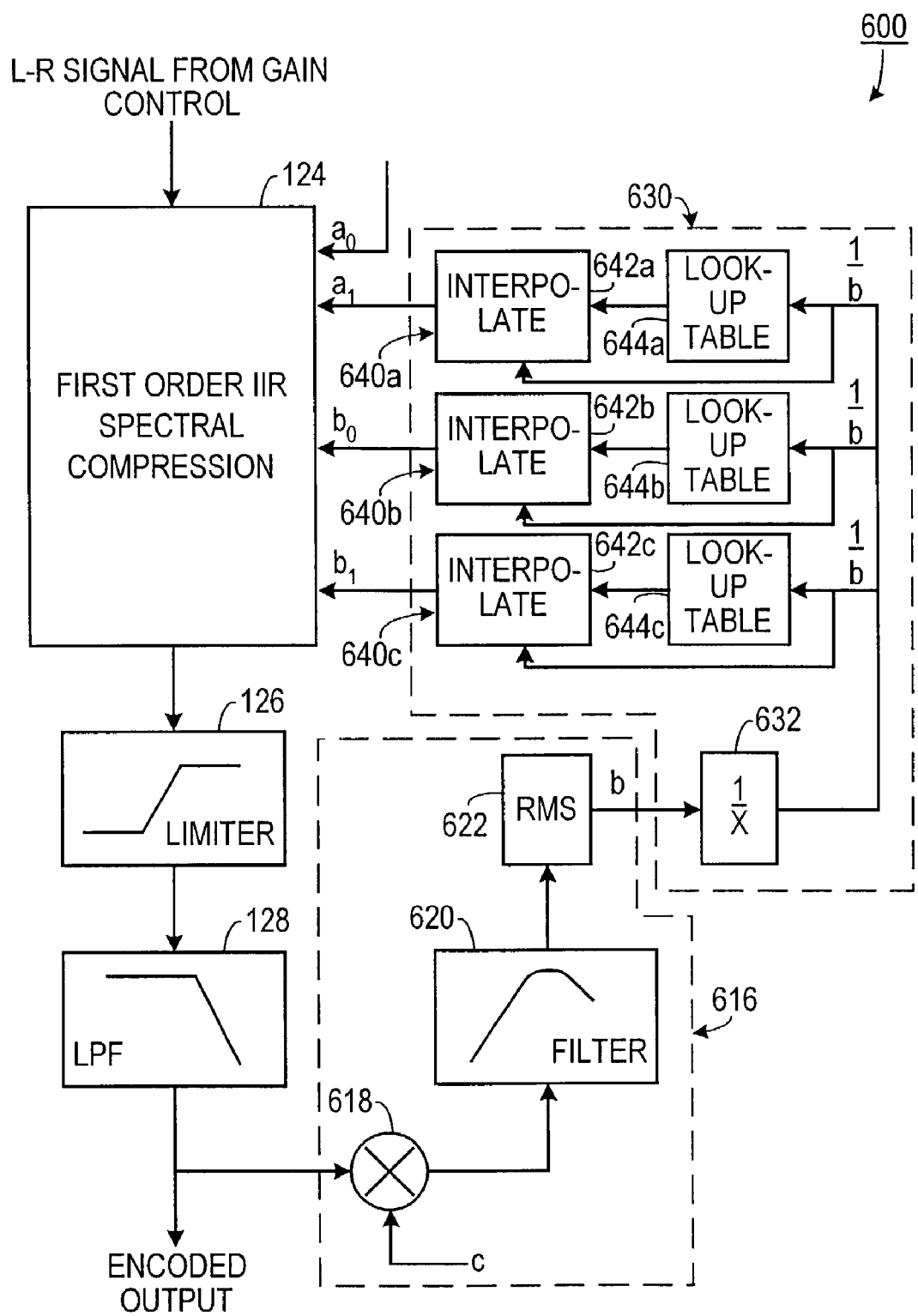
FIG. 6A is a schematic diagram of a circuit that generates filter coefficients, in accordance with one aspect of the invention.

The digital coefficient feedback signal 136 may actually comprise several variable spectral compression filter coefficients. As shown in FIG. 6A, in one illustrative embodiment, a coefficient calculating circuit 630 calculates the filter coefficients $a_0$, $a_1$, $b_0$, and $b_1$ from a feedback variable that was output by the variable coefficient compressor 124, which in one embodiment is a first order Infinite Impulse Response (IIR) filter. Each filter coefficient $a_1$, $b_0$, and $b_1$ is calculated by a different approximating circuit 640a (for $a_1$), 640b (for $b_0$) and 640c (for $b_1$). (In this embodiment, the value for $a_0$ is set at a constant value of "1.") While for this embodiment the IIR requires four filter coefficients, it will be understood that other IIR's could require a different number of filter coefficients.

The coefficient calculating circuit 630 includes a reciprocal value circuit 632 that calculates a reciprocal value that is proportional to a reciprocal value of the feedback variable. A lookup table 644 is indexed by the high order bits of the reciprocal value. A first portion of the lookup table 644 stores a plurality of discrete values at index points of a line segment corresponding to a filter coefficient function approximation. The first portion of the lookup table 644 generates an initial discrete value corresponding to the filter coefficient function at a value of the high order bits. A second portion of the lookup table 644 stores a plurality of slope values, wherein each slope value indicates a slope of a line segment of the filter coefficient function. The second portion of the lookup table 644 generates a slope value of the line segment corresponding to the filter coefficient function at the value of the high order bits. It will be appreciated by those skilled in the art that the lookup table 644 could include several physically separate lookup tables with each indexed by the high order bits.

Because of the nature of the coefficient functions, the coefficient functions of the reciprocal of the feedback variable tend to behave more linearly than the coefficient functions of the non-reciprocal feedback variable. Therefore, using the reciprocal of the feedback variable to index the lookup table 642 allows for the use of linear interpolation to approximate the filter coefficients $a_0$, $a_1$, $b_0$, and $b_1$.

Figure 6B:
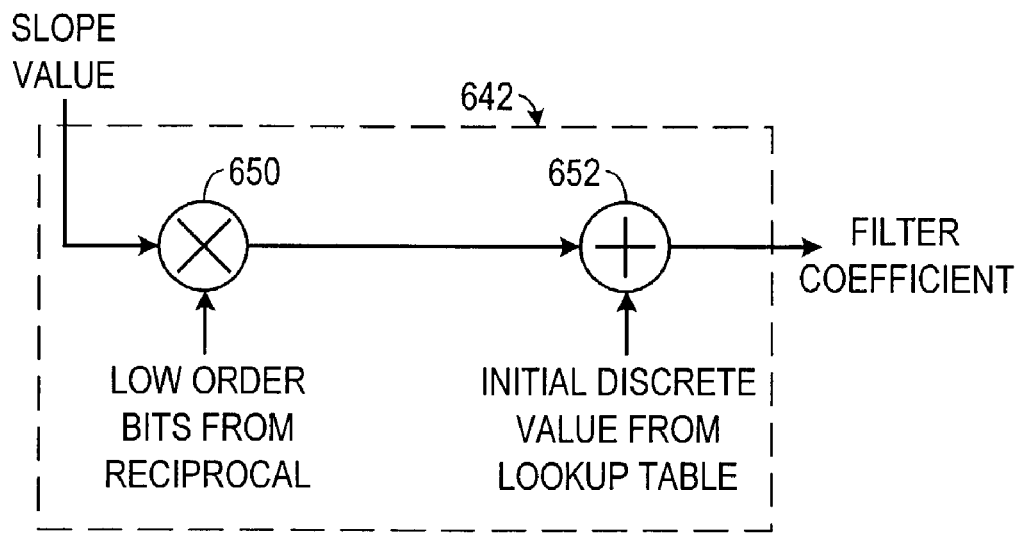
FIG. 6B is a schematic diagram of an interpolation circuit.

A linear interpolation circuit 642 interpolates an approximation of the compression filter coefficient based on the slope value, the initial discrete value and a preselected set of low order bits of the reciprocal value. In one embodiment, as shown in FIG. 6B, the interpolation circuit 642 includes a multiplier 650 that multiplies the slope value by the value of the low order bits of the reciprocal value to generate a product value. An adder 652 adds the initial discrete value from the lookup table 644 to the product value, thereby generating an approximation of the compression filter coefficient.

Returning to FIG. 6A, a feedback signal conditioning circuit 616 conditions the signal for use by the coefficient calculating circuit 630. The signal conditioning circuit 616 includes a multiplier 618 that multiplies the encoded output of the low pass filter 128 by a scaling constant c to generate a scaled version of the encoded output. A band pass filter 620 weighted to high frequencies generates a filtered signal from the scaled signal. A root-mean-squared 622 circuit generates a root-mean-squared version of the output of the conditioning circuit 616. The root-mean-squared version of the output of the conditioning circuit 616 is then transmitted to the coefficient calculating circuit 630.

Figure 6C:
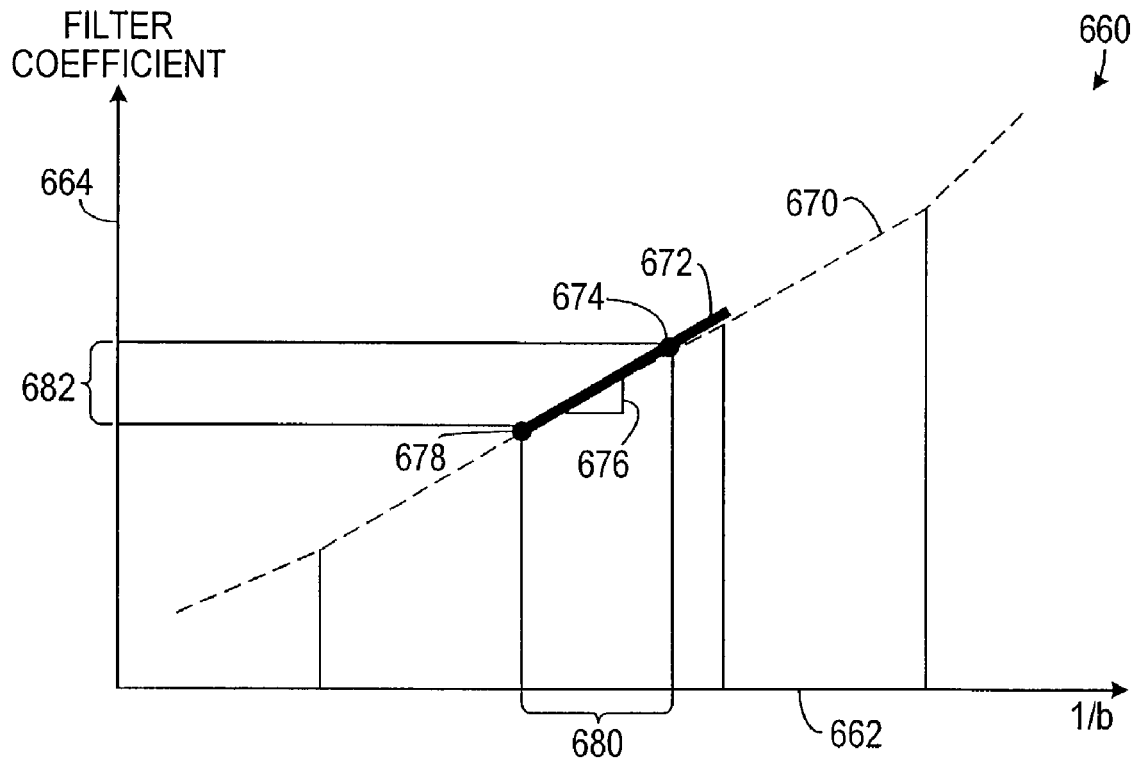
FIG. 6C is a graph showing one implementation of linear interpolation.

One illustrative implementation of linear interpolation that may be used with the invention is shown in FIG. 6C. As shown in FIG. 6C, the coefficient function 670 may be plotted on a graph 660 having a 1/b axis 662 and a filter coefficient axis 664. The high order bits of 1/b are used to index the lookup table to retrieve two parameters of a line segment 672 that locally approximates the filter coefficient function 670. The retrieved parameters include an initial value 678 of the line segment 672 and the slope 676 of the line segment. The low order bits 680 of 1/b times the slope 676 give a filter coefficient axis 664 offset 682 from the initial value 678 to provide the approximate value 674 of the filter coefficient.

The overall design strategy of the circuit disclosed includes: limiting output bandwidth to 13 KHz to simplify filter requirements; employing linear interpolation to two times the input sampling frequency before pre-emphasis; employing linear interpolation to four times the input sampling frequency, $F_S$, before bandwidth-limit filter; allowing the bandwidth limit filter to remove residual images from the interpolation; using the digital phase locked loop 140 to create sinusoidal $F_H$ and 2 $F_H$ at a sampling rate of 4 $F_S$; and modulating the left and right components of the audio signal by 2 $F_H$ and inserting the $F_H$ pilot digitally. All of this may be embodied on an application specific integrated circuit to reduce costs.

It will be appreciated that principles similar to those described above are applicable to a decoder as well as an encoder, as low cost filter components are beneficial in a decoder as well as an encoder. U.S. Pat. No. 6,259,482 to Easley, et. al. ("the '482 patent"), which is hereby incorporated by reference herein in its entirety, describes methods and system for digitally encoding stereo audio into a BTSC signal. Specifically, column 11 line 26 thru column 18 line 18 of the '482 patent describe a way to digitally implement the compressor portion of a BTSC encoder. Column 13 line 40 thru column 14 line 30, of the '482 patent, provides a description of an alternative technique for calculating the variable spectral compressor coefficients. This technique does not exploit the linear coefficient function obtained by taking the reciprocal of the feedback value. As described in the provisional U.S. patent application 60/370,064, which has been referenced herein and is incorporated by reference herein in its entirety, a decoder used to decode a BTSC signal to produce an uncompressed stereo audio signal implements method steps that are complementary to corresponding steps in a corresponding encoder.

Figure 7:
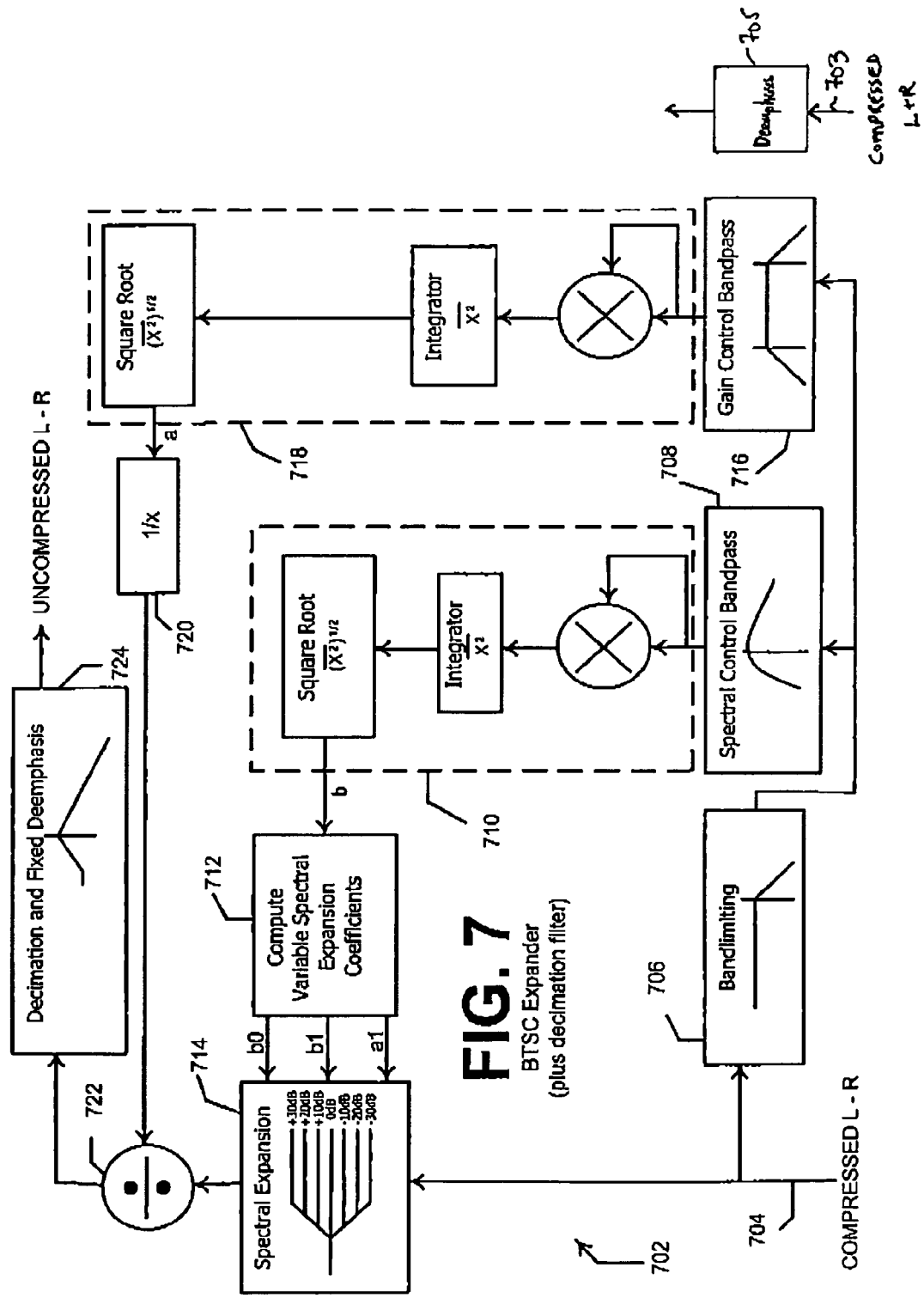
FIG. 7 illustrates a block diagram of the expander portion of a BTSC-compatible encoder according to one embodiment of the invention.

Turning now to FIG. 7, a block diagram of the expander portion of a BTSC decoder 702 is shown. A comoressed L+R BTSC compatible signal 703 is subject to deephasis at 705 so as to provide a deemphasized L+R BTSC compatible signal, while the compressed L−R BTSC compatible signal 704 is applied to an input of the decoder 702. Signal 704 is the equivalent of signal 104 in FIG. 1. It will be appreciated that signal 704 is typically a demodulated signal, the demodulation operation offsetting the amplitude modulation performed by multiplier 142 of FIG. 1. In this way the compressor and expander can be visualized as cascaded respectively with the feedback paths of the encoder and the feed-forward paths of the decoder processing the same signal. Part of the input signal 702 is routed to band limiting low pass filter 706 so as to limit the response of the feed forward loops to only those spectral components that are present in the compressed difference channel. The output of low pass filter 706 is provided to spectral control band pass filter 708, which attenuates frequencies that are not preemphasized, based on a predetermined preemphasis scheme. Spectral control band pass filter 708 is identical to that implemented in the encoder, or compressor. The output from spectral control band pass filter 708 is provided to RMS converter 710, which generates the RMS value of the signal that passes through band pass filter 708. Thus, the output of RMS converter 710 is the RMS value of the portion of the input signal for which preemphasis was applied at an encoder, as described in the '482 patent at col. 16, line 23-col. 17, line 40. This preemphasis RMS value is used to determine spectral expansion coefficients at spectral expansion coefficient generator 712. These coefficients, shown as $a_1$, $b_0$ and $b_1$ in the FIG, are used to expand signal 704 so that its spectral balance matches that of the signal before compression by an encoder. It will be appreciated that the transfer function of the spectral expander in the decoder is the reciprocal of the transfer function of the spectral compressor in the encoder; the computation of coefficients is similar. The expander numerator coefficients are the compressor denominator coefficients, and likewise, the expander denominator coefficients are the compressor numerator coefficients.

Spectral expander 714 uses coefficients generated by coefficient generator 712 to expand/decode the compressed signal 704. Each set of coefficients corresponds to a specific level of spectral expansion.

Following the application of the coefficients to the digital signal, the conditioned digital from expander 714 is combined with a signal proportional to the reciprocal of the band-limited portion of signal 704. After signal 704 passes through bandlimiter 706, the band-limited signal is passed through bandpass filter 716. Then, RMS converter 718 generates the RMS value of the signal from bandpass filter 716 and passes said RMS signal to reciprocal calculation block 720. The output of the reciprocal calculation block 720 is divided from the output of spectral expander 714 by divider 722. The signal output from divider 722 is then processed through decimator 724. A digital embodiment of this implementation for an encoder is described in column 15 line 1 through column 16 line 22 of the '482 patent. This present decoder embodiment is identical except for the fact that the decoder multiplies the signal by the reciprocal value. It will be appreciated that dividing the signal by the reciprocal of the feedforward value in the decoder offsets the effect of multiplying by the reciprocal of the feedback value in the encoder.

Decimator 724, which is calibrated to a predetermined sample rate, decimates the signal to a lower sample rate so that it can be output to an inexpensive audio digital to analog converter. While decimating, the decimator filter 724 also performs fixed deemphasis to the signal. The fixed deemphasis transfer function is typically the reciprocal of the fixed preemphasis transfer function used in the decoder. A digital implementation of the fixed preemphasis filter is described in column 12 line 31 through column 13 line 2 of the '482 patent.

It will be appreciated that the decoder, or expander 702, can function at sample rates that may be integer multiples of the horizontal sync frequency, $F_H$, or at sample rates that are not multiples thereof, as described in the '482 patent at col. 20, line 41-col. 22, line 17.

In an alternative embodiment, the coefficients are retrieved from lookup table 726, as discussed above.

The previous discussion has focused solely on the BTSC compressor and expander portion of a BTSC encoder and decoder. The input to this functionality is the difference (left minus right, or L−R) or SAP signals. In order to fully recover the left and right audio channels at the output of the decoder, a sum (left plus right, or L+R) channel must be processed and transmitted. The processing on this channel is a simple fixed preemphasis filter in the encoder and a reciprocal fixed deemphasis filter in the decoder. A digital implementation of sum channel processing is given in column 17, line 42 through column 18, line 18 of the '482 patent.

The above-described embodiments are given as illustrative examples only. It will be readily appreciated that many deviations may be made from the specific embodiments disclosed in this specification without departing from the invention. Accordingly, the scope of the invention is to be determined by the claims below rather than being limited to the specifically described embodiments above.

What is claimed is:

1. A method of calculating a variable spectral expansion filter coefficient in a BTSC compatible stereo decoder from a feed-forward variable, comprising:
   a. calculating a reciprocal value that is proportional to the feed-forward variable;
   b. indexing a lookup table using a pre-selected set of bits of the reciprocal value so to generate at least one parameter of a filter coefficient function; and
   c. linearly interpolating an approximation of the expansion filter coefficients based on the at least one parameter of the filter coefficient function.

2. A method of calculating a variable spectral expansion filter coefficient in a BTSC compatible stereo decoder from a feed-forward variable, comprising:
   a. calculating a reciprocal value that is proportional to the feed-forward variable;
   b. indexing a lookup table using a pre-selected set of high order bits of the reciprocal value so as to generate at least one parameter of a filter coefficient function, wherein a first portion of the lookup table stores a plurality of discrete values at index points of a line segment corresponding to a filter coefficient function approximation, so as to generate an initial discrete value corresponding to the filter coefficient function at a value of the high order bits, and wherein a second portion of the lookup table stores a plurality of slope values, each slope value indicating a slope of a line segment of the filter coefficient function, so as to generate a slope value of a line segment corresponding to the filter coefficient function at the value of the high order bits; and
   c. linearly interpolating an approximation of the expansion filter coefficient based on the slope value, the initial discrete value and a preselected set of low order bits of the reciprocal value.

3. The method claim 2, wherein linear interpolating comprises
   a. multiplying the slope value by a value of the pre-selected set of low order bits of the reciprocal value to generate a product value; and
   b. adding the initial discrete value to the product value so as to generate the approximation of the expansion filter coefficient.

4. The method claim 2, further comprising generating the expansion filter coefficient by calculating a root-mean-squared value of a scaled and filtered output of an infinite impulse response spectral expansion filter.

5. An apparatus for calculating a variable spectral expansion filter coefficient in a BTSC compatible stereo decoder from a feed-forward variable, comprising:
   a. a reciprocal value component configured and arranged so as to calculate a reciprocal value proportional to the feed-forward variable;
   b. a lookup table is indexed by a pre-selected set of high order bits of the reciprocal value, wherein a first portion of the lookup table stores a plurality of discrete values at index points of a line segment corresponding to a filter coefficient function approximation, so as to generate an initial discrete value corresponding to the filter coefficient function at a value of the high order bits, and wherein a second portion of the lookup table stores a plurality of slope values, each slope value indicating a slope of a line segment of the filter coefficient function, so as to generate a slope value of a line segment corresponding to the filter coefficient function at the value of the high order bits; and
   c. a linear interpolation component configured and arranged so as to interpolate an approximation of the expansion filter coefficient based on the slope value, the initial discrete value and a pre-selected set of low order bits of the reciprocal value.

6. The apparatus of claim 5, wherein the interpolation circuit comprises:
   a. a multiplier configured and arranged so as to multiply the slope value by a value of a pre-selected set of low order bits of the reciprocal value in order to generate a product value; and
   b. an adder that adds the initial discrete value to the product value, thereby generating an approximation of the expansion filter coefficient.

7. The apparatus of claim 5, further comprising a feed-forward signal conditioning component configured and arranged so as to generate a scaled, filtered and root-mean-squared signal corresponding to an output of an infinite impulse response spectral expansion filter.

8. The apparatus of claim 7, wherein the feed-forward signal conditioning component comprises a multiplier configured and arranged so as to multiply the output of an infinite impulse response spectral expansion filter by a scaling constant thereby generating a scaled signal.

9. The apparatus of claim 8, wherein the feed-forward signal conditioning component further comprises a band pass filter configured and arranged so as to generate a filtered signal from the scaled signal.

10. The apparatus of claim 9, wherein the feed-forward signal conditioning component further comprises a root-mean-squared component configured and arranged so as to generate a root-mean-squared signal corresponding to a value of the scaled signal root-mean-squared.

11. A method of calculating a variable spectral expansion filter coefficient in a BTSC compatible stereo decoder from a feed-forward variable, comprising:
   a. calculating a reciprocal value that is proportional to a reciprocal of the feed-forward variable;
   b. indexing a lookup table using a preselected set of bits of the reciprocal value to generate at least one parameter of a filter coefficient function; and
   c. linearly interpolating an approximation of the expansion filter coefficient based upon the at least one parameter of the filter coefficient function.

12. A method of calculating a variable spectral expansion filter coefficient in a BTSC compatible stereo decoder from a feed-forward variable, comprising:
   a. calculating a reciprocal value that is proportional to a reciprocal of the feed-forward variable;
   b. indexing a lookup table using a preselected set of high order bits of the reciprocal value, wherein a first portion of the lookup table stores a plurality of discrete values at index points of a line segment corresponding to a filter coefficient function approximation, so as to generate an initial discrete value corresponding to the filter coefficient function at a value of the high order bits, and wherein a second portion of the lookup table stores a plurality of slope values, each slope value indicating a slope of a line segment of the filter coefficient function, so as to generate a slope value of a line segment corresponding to the filter coefficient function at the value of the high order bits; and
   c. linearly interpolating an approximation of the expansion filter coefficient based on the slope value, the initial discrete value and a preselected set of low order bits of the reciprocal value.

13. The method claim 12, wherein the interpolating comprises:
   a. multiplying the slope value by a value of the preselected set of low order bits of the reciprocal value to generate a product value; and
   b. adding the initial discrete value to the product value thereby generating the approximation of the expansion filter coefficient.

14. The method claim 12, further comprising the step of generating the expansion filter coefficient by calculating a root-mean-squared value of a scaled and filtered output of an infinite impulse response spectral expansion filter.

15. An apparatus for calculating a variable spectral expansion filter coefficient in a BTSC compatible stereo encoder from a feed-forward variable, comprising:
   a. a reciprocal value circuit that calculates a reciprocal value that is proportional to a reciprocal of the feed-forward variable;
   b. a lookup table that is indexed by a preselected set of high order bits of the reciprocal value, wherein a first portion of the lookup table stores a plurality of discrete values at index points of a line segment corresponding to a filter coefficient function approximation, so as to generate an initial discrete value corresponding to the filter coefficient function at a value of the high order bits, and wherein a second portion of the lookup table stores a plurality of slope values, each slope value indicating a slope of a line segment of the filter coefficient function, so as to generate a slope value of a line segment corresponding to the filter coefficient function at the value of die high order bits; and
   c. a linear interpolation circuit that interpolates an approximation of the expansion filter coefficient based on die slope value, the initial discrete value and a preselected set of low order bits of the reciprocal value.

16. The apparatus of claim 15, wherein the interpolation circuit comprises: a. a multiplier that multiplies the slope value by a value of a preselected set of low order bits of the reciprocal value to generate a product value; and b. an adder that adds the initial discrete value to the product value, thereby generating an approximation of the expansion filter coefficient.

17. The apparatus of claim 15, further comprising a feed-forward signal conditioning circuit that generates a scaled, filtered and root-mean-squared signal corresponding to a, output of an infinite impulse response spectral expansion filter.

18. The apparatus of claim 17, wherein the feed-forward signal conditioning circuit comprises a multiplier that multiplies the output of an infinite impulse response spectral expansion filter by a scaling constant thereby generating a scaled signal.

19. The apparatus of claim 18, wherein the feed-forward signal conditioning circuit further comprises a band pass filter weighted to high that generates a filtered signal from the scaled signal.

20. The apparatus of claim 19 wherein the feed-forward signal conditioning circuit further comprises a root-mean-squared circuit that generates a root-mean-squared signal corresponding to a value of the scaled signal root-mean-squared.

* * * * *

UNITED STATES PATENT AND TRADEMARK OFFICE
CERTIFICATE OF CORRECTION

PATENT NO. : 7,397,850 B2
APPLICATION NO. : 10/407041
DATED : July 8, 2008
INVENTOR(S) : Matthew F. Easley et al.

Page 1 of 1

It is certified that error appears in the above-identified patent and that said Letters Patent is hereby corrected as shown below:

IN THE CLAIMS:

Column 10, line 21, delete "die" and replace with "the".
Column 10, line 23, delete "die" and replace with "the".

Signed and Sealed this

Tenth Day of March, 2009

JOHN DOLL
*Acting Director of the United States Patent and Trademark Office*